US010393826B2

(12) United States Patent
Parsa et al.

(10) Patent No.: US 10,393,826 B2
(45) Date of Patent: Aug. 27, 2019

(54) EXTENDED SIGNAL PATHS IN MICROFABRICATED SENSORS

(71) Applicant: Texas Instruments Incorporated, Dallas, TX (US)

(72) Inventors: Roozbeh Parsa, Portola Valley, CA (US); William French, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 10 days.

(21) Appl. No.: 15/348,966

(22) Filed: Nov. 10, 2016

(65) Prior Publication Data

US 2018/0128885 A1 May 10, 2018

(51) Int. Cl.

*G01R 33/032* (2006.01)
*G01R 33/00* (2006.01)
*G04F 5/14* (2006.01)

(52) U.S. Cl.

CPC ....... *G01R 33/032* (2013.01); *G01R 33/0052* (2013.01); *G04F 5/14* (2013.01)

(58) Field of Classification Search

None

See application file for complete search history.

(56) References Cited

U.S. PATENT DOCUMENTS

| | | | | |
|---|---|---|---|---|
| 5,493,177 A * | 2/1996 | Muller | G01J 3/108 | 313/578 |
| 2008/0094624 A1* | 4/2008 | Harsh | G01J 3/02 | 356/311 |
| 2011/0031969 A1* | 2/2011 | Kitching | G01R 33/0286 | 324/304 |
| 2015/0277386 A1* | 10/2015 | Passilly | G04F 5/145 | 331/94.1 |

* cited by examiner

*Primary Examiner* — Douglas X Rodriguez

(74) *Attorney, Agent, or Firm* — Rose Alyssa Keagy; Charles A. Brill; Frank D. Cimino

(57) ABSTRACT

A microfabricated sensor includes a first reflector and a second reflector in a sensor cell, separated by a cavity path segment through a sensor cavity in the sensor cell. A signal window is part of the sensor cell. A signal emitter and a signal detector are disposed outside of the sensor cavity. The signal emitter is separated from the first reflector by an emitter path segment which extends through the signal window. The second reflector is separated from the second reflector by a detector path segment which extends through the signal window.

20 Claims, 7 Drawing Sheets

EXTENDED SIGNAL PATHS IN MICROFABRICATED SENSORS

FIELD OF THE INVENTION

This invention relates to the field of microfabricated sensors.

BACKGROUND OF THE INVENTION

Microfabricated sensors such as microfabricated atomic clocks and microfabricated atomic magnetometers are efficiently assembled by vertically integrating the components. The laser signal source is typically located below the alkali vapor optical cavity; the optical cavity has windows for top and bottom plates to allow the laser light through. The photodetector is located over the optical cavity, so that the signal path extends vertically through the optical cavity. A drawback of this vertical component integration is the signal path through the alkali vapor is defined by the thickness of the cell body between the top and bottom plates of the optical cavity, which is commonly about 1 millimeter, undesirably limiting the signal from the sensor. Another drawback is that the total height of the microfabricated sensor is undesirably large, often precluding use in miniature or handheld applications. Designs which increase the thickness of the cell body exacerbate the problems associated with the total height.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A microfabricated sensor includes a sensor cell, a signal emitter and a signal detector. The sensor cell includes a cell body attached to a signal window, with a sensor cavity at least partially bounded by the cell body and the signal window. Sensor fluid material is disposed in the sensor cavity. A first reflector and a second reflector are disposed in the sensor cell, separated by a cavity path segment through the sensor cavity. The signal emitter and the signal detector are disposed outside of the sensor cavity. The signal emitter is separated from the first reflector by an emitter path segment. The signal detector is separated from the second reflector by a detector path segment.

DETAILED DESCRIPTION OF EXAMPLE EMBODIMENTS

Figure 1:
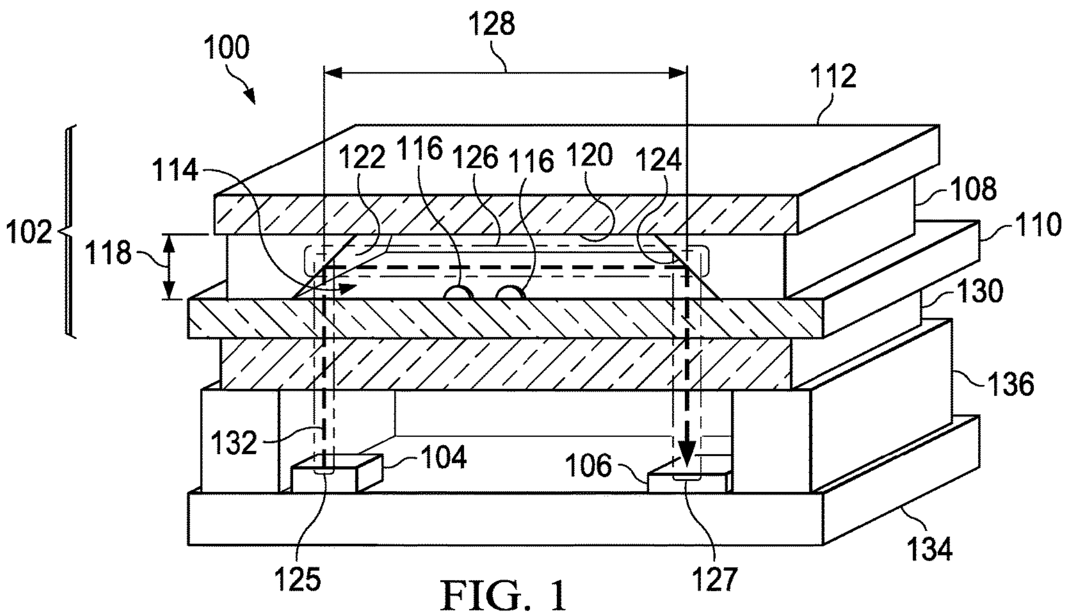
FIG. 1 is a cross section of an example microfabricated sensor.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A microfabricated sensor includes a sensor cell, a signal emitter and a signal detector. The sensor cell includes a cell body attached to a signal window, with a sensor cavity at least partially bounded by the cell body and the signal window. The sensor cell may include a top plate attached to the cell body opposite from the signal window, so that the sensor cavity is bounded by the cell body, the signal window and the top plate. Alternatively, the cell body may bound the sensor cavity opposite from the signal window, so that the sensor cavity is bounded by the cell body and the signal window. The sensor cavity has a thickness which is perpendicular to an interior surface of the signal window which defines a portion of a boundary of the sensor cavity.

Sensor fluid material is disposed in the sensor cavity. The sensor fluid material may include a condensed phase of the sensor fluid, such as an alkali metal, possibly cesium. The sensor fluid material may include a compound of the sensor fluid and an inert material. An example of such a compound is cesium azide.

A first reflector and a second reflector are disposed in the sensor cell, separated by a cavity path segment through the sensor cavity, which is substantially parallel to the interior surface of the signal window. The signal emitter is disposed outside of the sensor cavity, and is configured to emit a signal through the signal window to the first reflector. The signal detector is disposed outside of the sensor cavity, and is configured to receive the signal through the signal window from the second reflector. The first reflector is configured to reflect the signal from the signal emitter to the second reflector. The second reflector is configured to reflect the signal from the first reflector to the signal detector. The cavity path segment between the first reflector and the second reflector is greater than a thickness of the sensor cavity, the thickness being perpendicular to the signal window. Configuring the signal path to include the cavity path segment between the first reflector and the second reflector, the cavity path segment being located in the sensor cavity, advantageously increases a length of the signal path through the sensor cavity compared with a conventional signal path configuration perpendicular to the signal window.

FIG. 1 is a cross section of an example microfabricated sensor. The microfabricated sensor 100 may be, for example a microfabricated atomic magnetometer or a microfabricated atomic clock. The microfabricated sensor 100 includes a sensor cell 102, a signal emitter 104 and a signal detector 106. The sensor cell 102 includes a cell body 108 attached to a signal window 110. In the instant example, the sensor cell 102 further includes a top plate 112 attached to the cell body 108 opposite from the signal window 110. A sensor cavity 114 is enclosed by the cell body 108, the signal window 110 and the top plate 112. Sensor fluid material 116 may be disposed in the sensor cavity 114, depicted in FIG. 1 as cesium metal in a condensed phase. The sensor cavity 114 has a thickness 118 less than 2 millimeters in a direction perpendicular to an interior surface 120 of the signal window 110; the interior surface 120 defines a portion of a boundary of the sensor cavity 114. The sensor cell 102 includes a first reflector 122 and a second reflector 124, separated by a cavity path segment 126 in the sensor cavity 114; a length 128 of the cavity path segment 126 is greater than the thickness 118 of the sensor cavity 114. In the instant example, the first reflector 122 and the second reflector 124 are provided by sloped sidewalls of the cell body 108. An optional signal conditioning element 130 may be disposed adjacent to the signal window 110. Alternatively, the optional signal conditioning element 130 may be integrated into the signal window 110.

A signal path 132 is depicted in FIG. 1 by a dashed line. The signal path 132 includes the cavity path segment 126, an emitter path segment 125, and a detector path segment 127. The emitter path segment 125 extends from the signal emitter 104 through the signal window 110, and the signal conditioning element 130 if present, to the first reflector 122. The detector path segment 127 extends from the second reflector 124 through the signal window 110 to the signal detector 106. The configuration of the microfabricated sensor 100 with the signal path 132 including the cavity path segment 126 may advantageously increase performance by providing a longer interaction length of the signal with the sensor fluid in the sensor cavity 114.

The signal emitter 104 may be an optical signal emitter, such as a laser, possibly a vertical cavity surface emitting laser (VCSEL). Alternatively, the signal emitter 104 may be a terahertz emitter, microwave emitter or other source of electromagnetic radiation. Other forms of signal emitters, such as acoustic signal emitters, are within the scope of the instant example. The signal detector 106 may be a photodiode or other detector appropriate for the signal provided by the signal emitter 104. The signal emitter 104 and the signal detector 106 may be disposed on a base support structure 134 with a standoff structure 136.

The signal window 110 includes material which is transmissive to the signal from the signal emitter 104 to the first reflector 122, and from the second reflector 124 to the signal detector 106. For example, the signal window 110 may include optically transparent material such as glass, quartz, or sapphire. The signal window 110 may further include one or more layers which provide anti-reflection, adhesion and other properties of the signal window 110. The signal conditioning element 130 may include, for example, a quarter wave circular polarizing element.

The cell body 108 may include structural material appropriate for structural integrity of the sensor cell 102, such as crystalline silicon, glass, or metal. In the instant example, the first reflector 122 and the second reflector 124 are provided by flat reflective surfaces of the cell body 108 in the sensor cavity 114. The first reflector 122 and the second reflector 124 may be oriented at angles of substantially 45 degrees with respect to the interior surface 120 of the signal window 110, to efficiently reflect the signal. Coatings may be disposed on the first reflector 122 and the second reflector 124 to more efficiently reflect the signal.

The top plate 112 may include material such as glass which provides structural integrity for the sensor cell 102, including a bond between the top plate 112 and the cell body 108. The top plate 112 may be attached to the cell body 108 by any of various processes, including anodic bonding, welding, brazing, soldering or gluing. The microfabricated sensor 100 may include heater elements to heat the sensor cell 102 to convert the sensor fluid material 116 to a vapor phase during operation. The microfabricated sensor 100 may include electrical connections such as metal leads to the signal emitter 104 and the signal detector 106.

Locating the signal emitter 104 and the signal detector 106 on a same side of the sensor cell 102 may advantageously enable a reduced total height for the microfabricated sensor 100. Configuring the sensor cell 102 to have the signal path 132 extending between the first reflector 122 and the second reflector 124 may advantageously enable a desired interaction length of the signal with the sensor fluid, while simultaneously enabling a thinner cell body 108 which may further enable a reduced total height for the microfabricated sensor 100. An optical focusing element such as a lens may optionally be disposed between the signal emitter 104 and the first reflector 122 to advantageously limit divergence of the signal along the signal path 132.

Figure 2A:
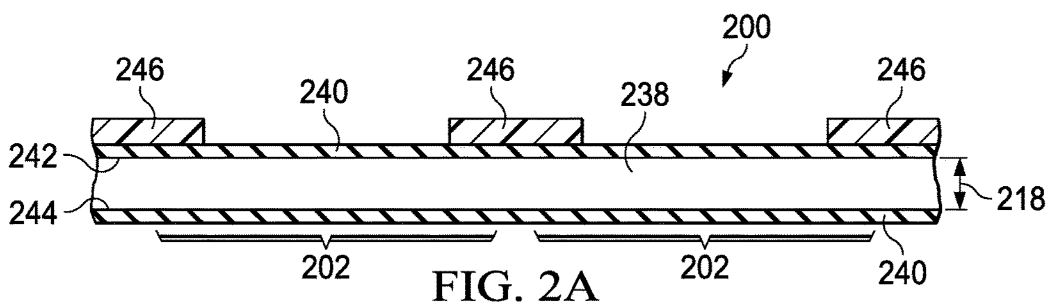
FIG. 2A through FIG. 2H are cross sections of a sensor cell of a microfabricated sensor, depicted in stages of an example method of formation.

FIG. 2A through FIG. 2H are cross sections of a sensor cell of a microfabricated sensor, depicted in stages of an example method of formation. Referring to FIG. 2A, formation of the sensor cell 202 of the microfabricated sensor 200 starts with providing a cell body workpiece 238, which in the instant example may be a single crystal silicon wafer 238 or other single crystal semiconductor wafer. In the instant example, the silicon wafer 238 has areas for a plurality of the sensor cells 202. The silicon wafer 238 may have a crystal orientation that is about 9.7 degrees off of a <100> orientation, which provides a desired orientation for etching symmetrical surfaces at 45 degrees for subsequently-formed reflectors. Deviation of the crystal orientation from 9.7 degrees off of the <100> orientation is acceptable to the extent that lack of symmetry between the subsequently-formed reflectors is acceptable. The silicon wafer 238 has a thickness 218 that is substantially equal to a desired thickness of a subsequently-formed sensor cavity.

A layer of hard mask material 240 is formed on a front surface 242 and a back surface 244 of the silicon wafer 238. The layer of hard mask material 240 may include, for example, a sub-layer of silicon dioxide 100 nanometers to 300 nanometers thick, formed on the silicon wafer 238 by a thermal oxidation process, and a sub-layer of silicon nitride 100 nanometers to 300 nanometers thick, formed on the sub-layer of silicon dioxide by a low pressure chemical vapor deposition (LPCVD) process. Silicon nitride has a very low etch rate in common crystallographic etch solutions for silicon. Silicon dioxide provides a good adhesion layer for the silicon nitride.

A photoresist mask 246 is formed on the layer of hard mask material 240 over the front surface 242, exposing an area for a sensor cavity in each area for the sensor cells 202. The photoresist mask 246 may be, for example, 300 nanometers to 500 nanometers thick, formed by a photolithographic process.

Figure 2B:
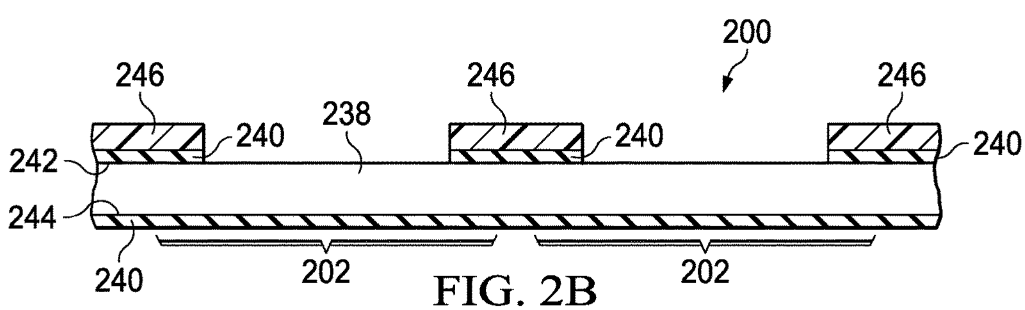

Referring to FIG. 2B, the layer of hard mask material 240 is removed from over the front surface 242 of the silicon wafer 238 in the areas exposed by the photoresist mask 246. Silicon nitride in the layer of hard mask material 240 may be removed, for example, by a plasma etch process using fluorine radicals and oxygen, possibly a reactive ion etch (RIE) process. Silicon dioxide in the layer of hard mask material 240 may subsequently be removed, for example, by a different plasma etch process using fluorine radicals, also possibly an RIE process. The layer of hard mask material 240 is removed from over the front surface 242 without degrading the layer of hard mask material 240 on the back surface 244 of the silicon wafer 238.

Figure 2C:
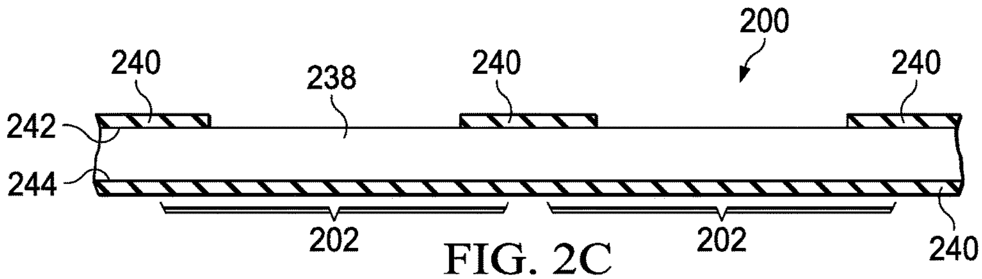

Referring to FIG. 2C, the photoresist mask 246 of FIG. 2B optionally may be removed, to avoid interfering with a subsequent wet etch process. The photoresist mask 246 may be removed, for example, by an asher process using oxygen radicals, or by a wet removal process using organic acids and solvents. Removal of the photoresist mask 246 may be followed by a wet clean process using an aqueous mixture of sulfuric acid and hydrogen peroxide, to remove any organic residue.

Figure 2D:
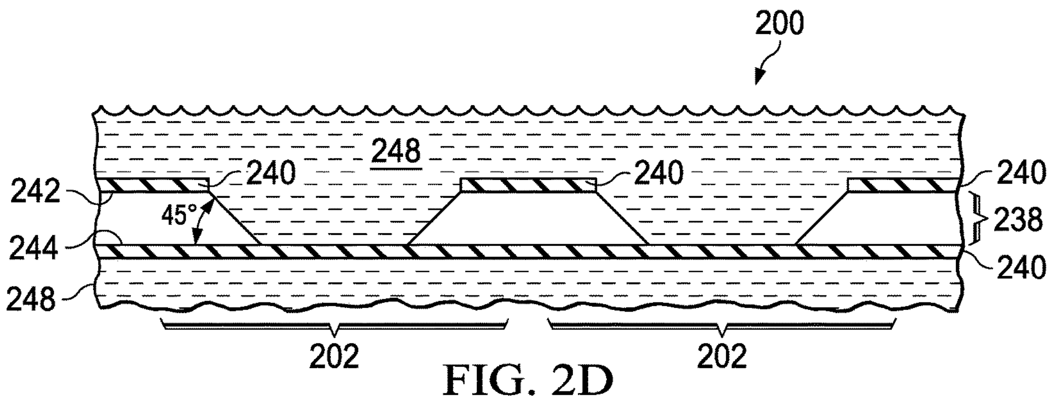

Referring to FIG. 2D, the silicon wafer 238 is removed by a crystallographic etch process 248 in the areas exposed by the patterned layer of hard mask material 240. The crystallographic etch process 248 may include, for example, an aqueous solution of 20 percent to 30 percent potassium hydroxide, or an aqueous solution of tetramethyl ammonium hydroxide with a pH greater than 12. The crystallographic etch process 248 may have a temperature of 40° C. to 90° C. The crystallographic etch process 248 has a very low etch rate on certain crystallographic planes of the silicon wafer 238, such as the <111> plane, so that facets are formed at sidewalls of the etched areas with desired angles, for example 45 degrees as indicated in FIG. 2D. In the instant example, the crystallographic etch process 248 is continued until the layer of hard mask material 240 on the back surface 244 is exposed. The layer of hard mask material 240 on the back surface 244 prevents removal of silicon from the silicon wafer 238 from the back surface 244, thus providing the facets at the sidewalls are continuous from the front surface 242 to the back surface 244.

Figure 2E:
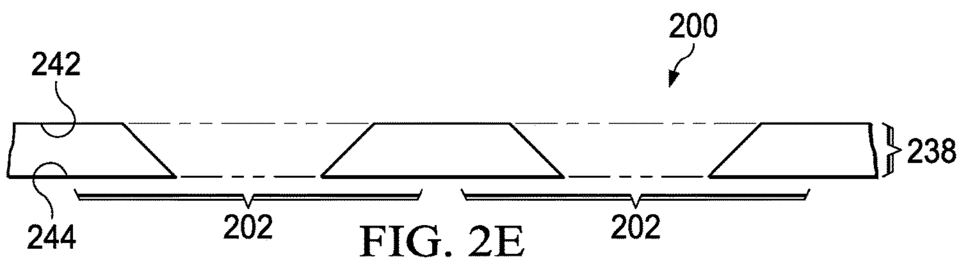

Referring to FIG. 2E, the layer of hard mask material 240 of FIG. 2D is removed from the silicon wafer 238. Silicon nitride in the layer of hard mask material 240 may be removed, for example, by an aqueous solution of phosphoric acid at 140° C. to 180° C. Silicon dioxide in the layer of hard mask material 240 protects the silicon wafer 238 from the silicon nitride removal process. Silicon dioxide in the layer of hard mask material 240 may subsequently be removed by an aqueous buffered solution of dilute hydrofluoric acid.

Figure 2F:
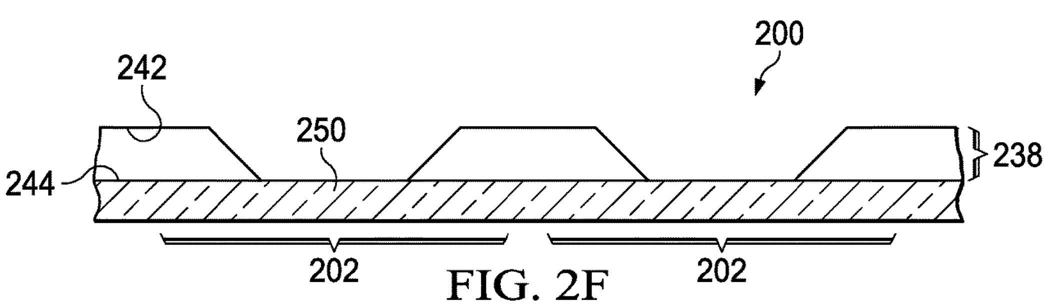

Referring to FIG. 2F, the silicon wafer 238 is attached to a top plate wafer 250 at the back surface 244. The top plate wafer 250 may have a diameter substantially equal to a diameter of the silicon wafer 238, advantageously facilitating economical formation of multiple instances of the sensor cells 202. In a version of the instant example in which the top plate wafer 250 is manifested as a glass wafer, the silicon wafer 238 may be attached to the top plate wafer 250 by anodic bonding, which includes applying a positive voltage bias to the silicon wafer 238 with respect to the top plate wafer 250. Other methods of attaching the silicon wafer 238 to the top plate wafer 250, such as welding, soldering, or gluing, are within the scope of the instant example.

Figure 2G:
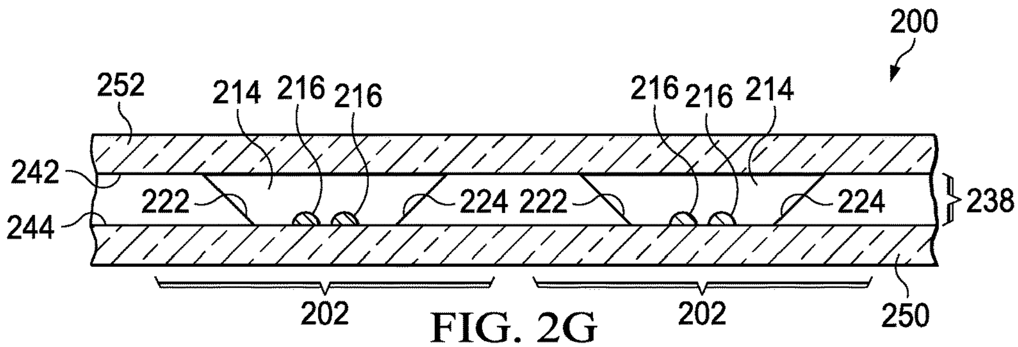

Referring to FIG. 2G, sensor fluid material 216 is placed on the top plate wafer 250, in a sensor cavity 214 which is partially bounded by the top plate wafer 250 and the silicon wafer 238. The sensor fluid material 216 may be a condensed phase compound of sensor fluid and another material, providing a more convenient form for placing a desired amount of the sensor fluid into the sensor cavity 214. For example, in a version of the microfabricated sensor 200 using an alkali metal such as cesium as the sensor fluid, the sensor fluid material 216 may include cesium azide, which is a solid at room temperature.

After the sensor fluid material 216 is placed on the top plate wafer 250, a signal window wafer 252 is attached to the silicon wafer 238 at the front surface 242, thus sealing the sensor fluid material 216 in the sensor cavity 214. The signal window wafer 252 may have a diameter substantially equal to a diameter of the silicon wafer 238, further facilitating economical formation of multiple instances of the sensor cells 202. The signal window wafer 252 may be attached to the silicon wafer 238 by a similar process used to attach the top plate wafer 250. The sloped facets of the silicon wafer 238 bounding the sensor cavity 214 provide a first reflector 222 and a second reflector 224 of the sensor cell 202.

Figure 2H:
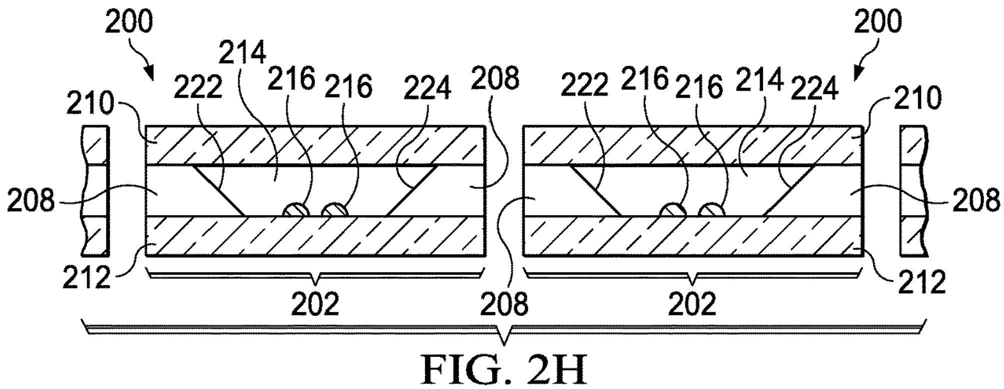

Referring to FIG. 2H, the combined silicon wafer 238, top plate wafer 250 and signal window wafer 252 of FIG. 2G are singulated to form separate sensor cells 202. The silicon wafer 238 provides cell bodies 208 of the sensor cells 202. The top plate wafer 250 provides top plates 212 of the sensor cells, and the signal window wafer 252 provides signal windows 210 of the sensor cells 202. The silicon wafer 238, top plate wafer 250 and signal window wafer 252 may be singulated, for example, by sawing, mechanical scribing, or laser scribing. The sensor cells 202 may be inverted during assembly into the microfabricated sensors 200, to provide a configuration similar to that depicted in FIG. 1.

Figure 3A:
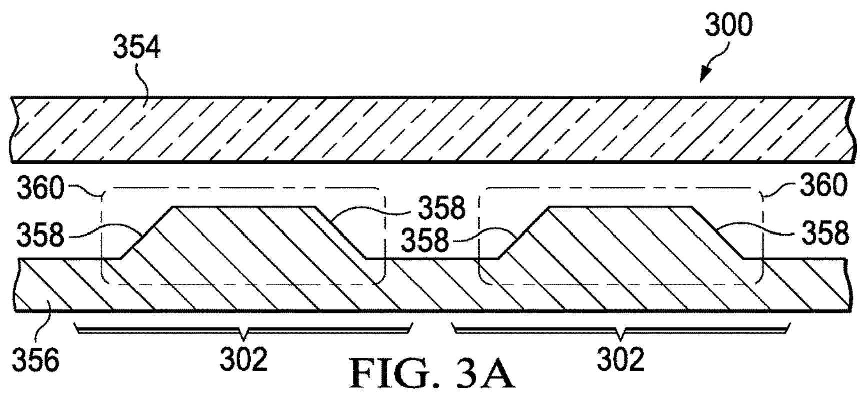
FIG. 3A through FIG. 3D are cross sections of a sensor cell of a microfabricated sensor, depicted in stages of another example method of formation.

FIG. 3A through FIG. 3D are cross sections of a sensor cell of a microfabricated sensor, depicted in stages of another example method of formation. Referring to FIG. 3A, a cell body workpiece 354, which in the instant example may be a cell body blank 354 of moldable material, is positioned over a mold plate 356. The cell body blank 354 may primarily include non-crystalline material such as glass, plastic, metal, ceramic slurry, or other material capable of being molded using the mold plate 356 and suitable for forming a cell body of the sensor cell 302 of the microfabricated sensor 300. The mold plate 356 may include metal, ceramic, glass or other suitable mold material. The cell body blank 354 and the mold plate 356 have areas for at least one sensor cell 302, and possibly a plurality of sensor cells 302, each sensor cell 302 to be part of a respective microfabricated sensor 300. The mold plate 356 has sloped faces 358 to form reflectors for the sensor cells 302. The mold plate 356 has a raised portion 360 to form a sensor cavity in each sensor cell 302. The cell body blank 354 and/or the mold plate 356 may be heated or otherwise prepared for a subsequent molding process.

Figure 3B:
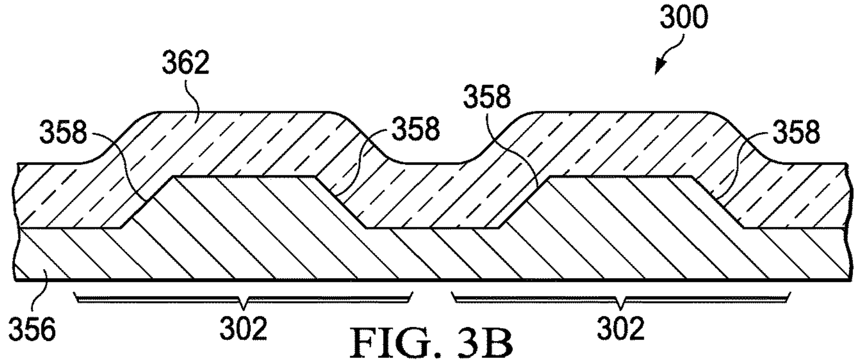

Referring to FIG. 3B, the cell body blank 354 of FIG. 3A is molded onto the mold plate 356 to form a cell body plate 362. Surface features of the mold plate 356, including the sloped faces 358, are replicated in the cell body plate 362. Pressure may be applied to the cell body blank 354 to enhance the replication of the surface features of the mold plate 356. Similarly, a vacuum may be applied between the cell body blank 354 and the mold plate 356 to enhance the replication of the surface features. In the instant example, the cell body plate 362 remains free of holes in the areas for the sensor cells 302 after the cell body blank 354 is molded onto the mold plate 356.

Figure 3C:
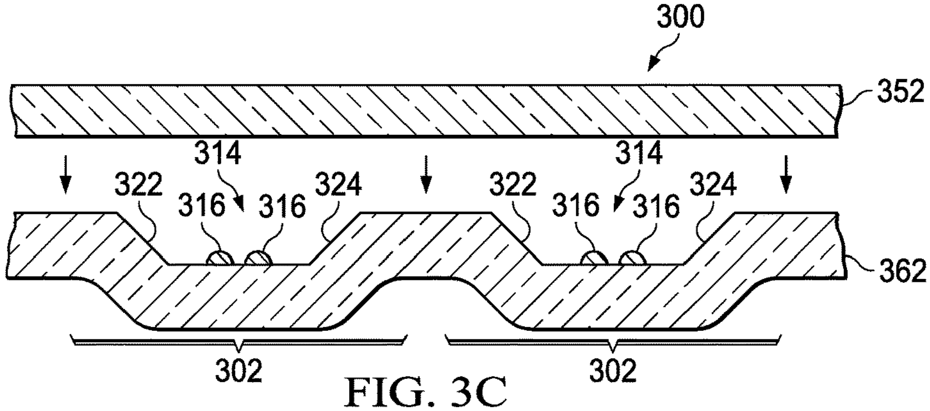

Referring to FIG. 3C, sensor fluid material 316 is placed on the cell body plate 362 in a sensor cavity 314 of each sensor cell 302. A first reflector 322 and a second reflector 324 are disposed in each sensor cell 302, formed by the sloped faces 358 of the mold plate 356 of FIG. 3B.

A signal window plate 352 is attached to the cell body plate 362, sealing the sensor fluid material 316 in the sensor cavity 314. The signal window plate 352 may be attached by any of various methods, including anodic bonding, soldering, brazing, welding or gluing.

Figure 3D:
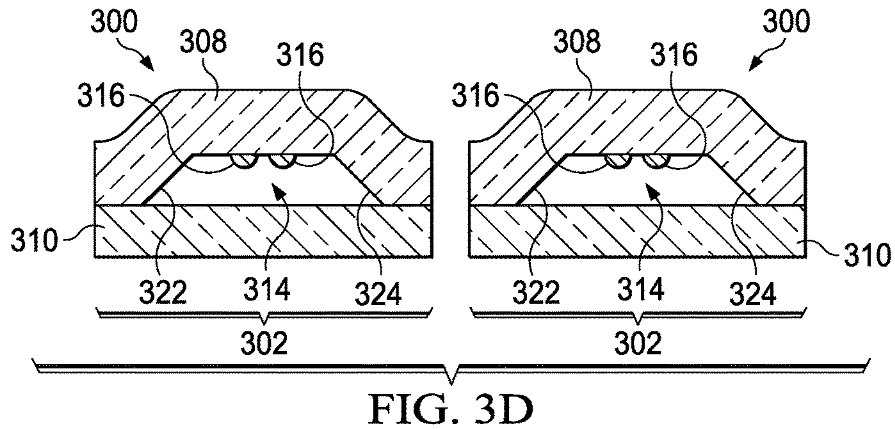

Referring to FIG. 3D, the combined cell body plate 362 and signal window wafer 352 of FIG. 3C are singulated to form separate sensor cells 302. The cell body plate 362 provides cell bodies 308 of the sensor cells 302. The signal window wafer 352 provides signal windows 310 of the sensor cells 302. Each cell body 308 extends across the corresponding sensor cavity 314 opposite from the signal window 310, so that the sensor cavity 314 is bounded by the cell body 308 and the corresponding signal window 310, without a separate top plate. The cell body plate 362 and signal window wafer 352 may be singulated as described in reference to FIG. 2H.

Figure 4A:
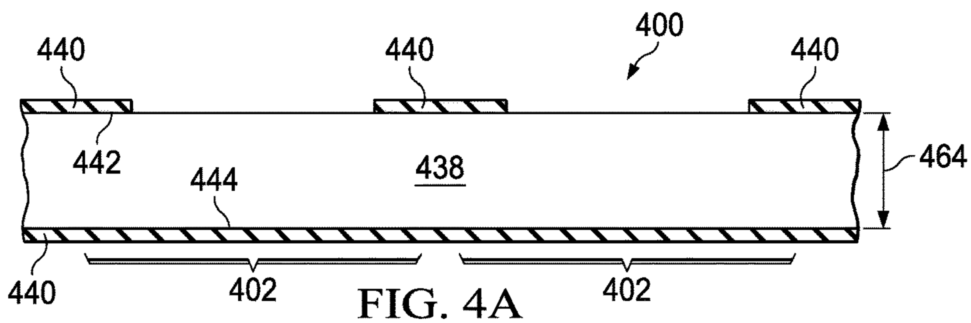
FIG. 4A through FIG. 4E are cross sections of a sensor cell of a microfabricated sensor, depicted in stages of a further example method of formation.

FIG. 4A through FIG. 4E are cross sections of a sensor cell of a microfabricated sensor, depicted in stages of a further example method of formation. Referring to FIG. 4A, a cell body workpiece 438, which in the instant example may be a single crystal silicon wafer 438, has areas for a plurality of sensor cells 402 of respective microfabricated sensors 400. The silicon wafer 438 may have a crystal orientation that provides a desired orientation for etching surfaces for subsequently-formed reflectors, for example about 9.7 degrees off of a <100> orientation. In the instant example, the silicon wafer 438 has a thickness 464 sufficient to provide a cell body including an integral top plate, for example, 1.0 millimeters to 2.0 millimeters.

A hard mask 440 is formed on a front surface 442 and a back surface 444 of the silicon wafer 438. The hard mask 440 may have a similar layer structure as described in reference to FIG. 2A, and may be formed by a similar process. Other structures and formation processes for the hard mask 440 are within the scope of the instant example.

Figure 4B:
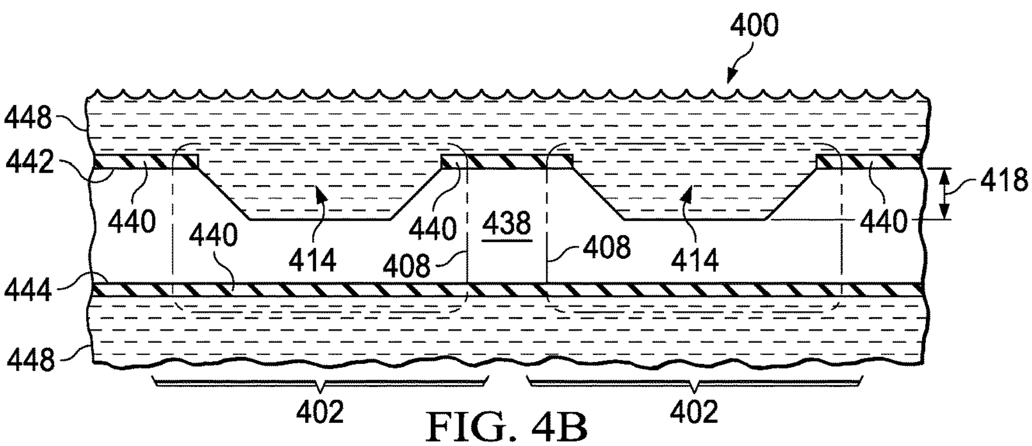

Referring to FIG. 4B, a portion of the silicon wafer 438 is removed at the front surface 442 by a crystallographic etch process 448 in the areas exposed by the patterned layer of hard mask material 440. The crystallographic etch process 448 removes silicon from a sensor cavity areas 414 in the silicon wafer 438, so that facets are formed at sidewalls of the etched areas with desired angles to provide reflectors in the sensor cells 402. In the instant example, the crystallographic etch process 448 is continued until a desired depth 418 for the sensor cavities 414 is attained, leaving silicon along the back surface 444 to provide integrated cell bodies 408 of the sensor cells 402. The hard mask 440 on the back surface 444 prevents removal of silicon from the silicon wafer 438 from the back surface 444.

Figure 4C:
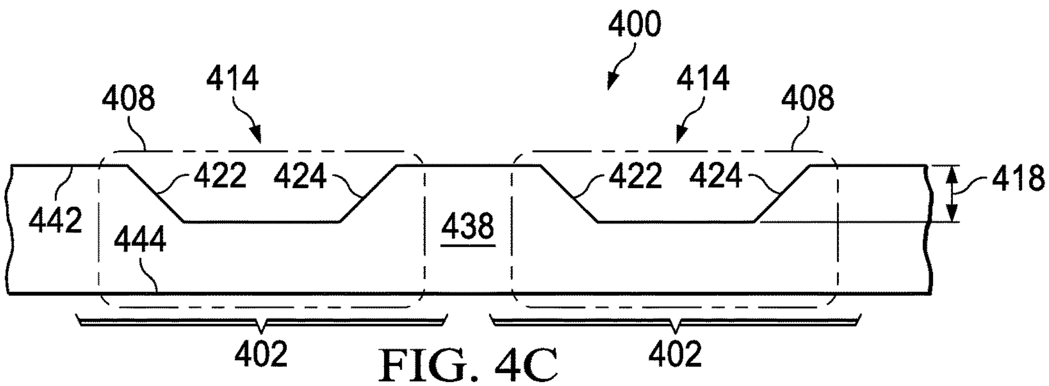

Referring to FIG. 4C, the hard mask 440 of FIG. 4B is removed from the silicon wafer 438. The sloped sidewalls of the sensor cavities 414 provide a first reflector 422 and a second reflector 424 in each sensor cell 402. Forming the integrated cell bodies 408 from a single silicon wafer 438 using the single etch process 448 of FIG. 4B may advantageously reduce a fabrication cost of each sensor cell 402.

Figure 4D:
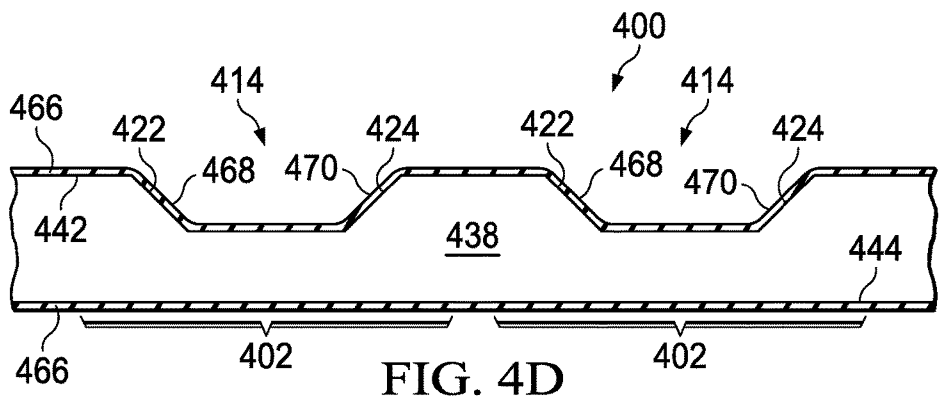

Referring to FIG. 4D, a dielectric layer 466 is formed on the first reflector 422 and the second reflector 424 in each sensor cell 402 to provide a first anti-reflection coating 468 of the first reflector 422 and a second anti-reflection coating 470 of the second reflector 424. The dielectric layer 466 may be formed on exposed silicon on the front surface 442 and back surface 444 of the silicon wafer 438, as depicted in FIG. 4D, for example by a thermal oxidation process. Alternatively, the dielectric layer 466 may be formed on the first reflector 422 and the second reflector 424 in each sensor cell 402, without being formed on the back surface 444, for example by a sputter process or an evaporation process.

Figure 4E:
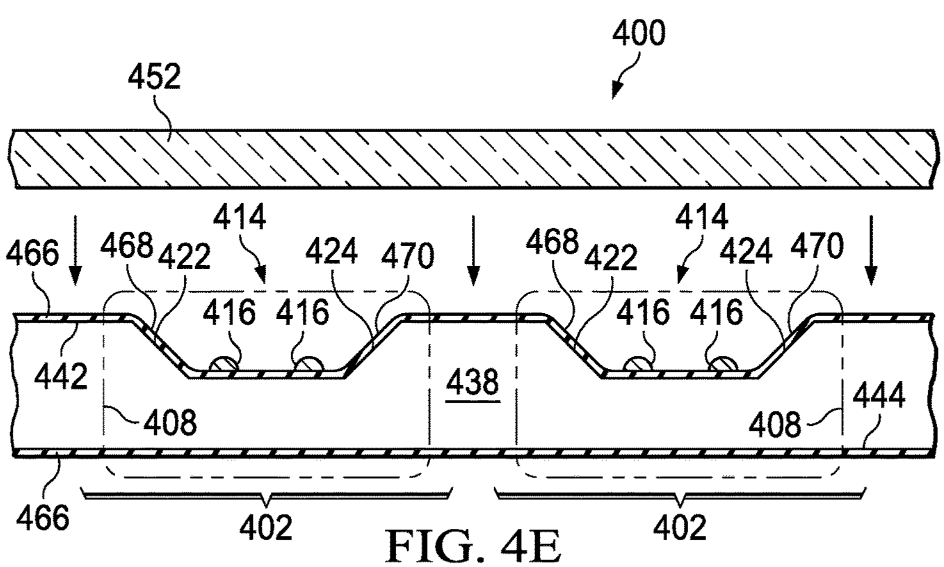

Referring to FIG. 4E, sensor fluid material 416 is placed in each sensor cavity 414. Subsequently, a signal window wafer 452 is attached to the silicon wafer 438 at the front surface 442, thus sealing the sensor fluid material 416 in the sensor cavity 414. The combined silicon wafer 438 and signal window wafer 452 are singulated to form separate sensor cells 402.

Figure 5:
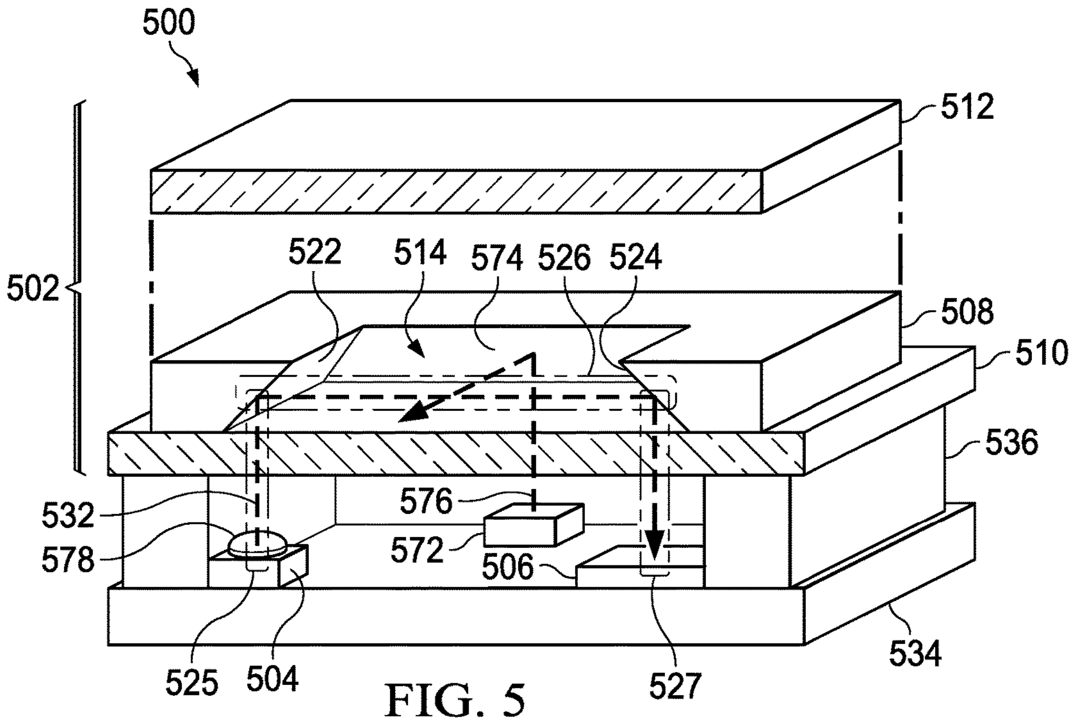
FIG. 5 is a cross section of another example microfabricated sensor.

FIG. 5 is a cross section of another example microfabricated sensor. The microfabricated sensor 500 includes a sensor cell 502, a signal emitter 504, a signal detector 506 and a pump emitter 572. The signal emitter 504 and the pump emitter 572 may both be configured to emit electromagnetic radiation with similar wavelengths. For example, the signal emitter 504 and the pump emitter 572 may both be VCSELs. The signal detector 506 may be, for example a solid state photodetector.

The sensor cell 502 includes a cell body 508 attached to a signal window 510, and a top plate 512 attached to the cell body 508 opposite from the signal window 510. A sensor cavity 514 is enclosed by the cell body 508, the signal window 510 and the top plate 512. The top plate 512 of the sensor cell 502 is depicted separated from the cell body 508 in FIG. 5 to more clearly show the configuration in the sensor cavity 514. Sensor fluid material, not shown in FIG. 5, may be disposed in the sensor cavity 514, for example in a vapor phase distributed throughout the sensor cavity 514.

The sensor cell 502 includes a first reflector 522 and a second reflector 524, separated by a cavity path segment 526 in the sensor cavity 514. The cavity path segment 526 is part of a signal path 532, depicted in FIG. 5 by a dashed line. The signal path 532 also includes an emitter path segment 525, and a detector path segment 527. The emitter path segment 525 extends from the signal emitter 504 through the signal window 510 to the first reflector 522. The detector path segment 527 extends from the second reflector 524 through the signal window 510 to the signal detector 506.

In the instant example, the sensor cell 502 includes a third reflector 574 and a pump emitter 572. A pump path 576, depicted in FIG. 5 by a dashed line, extends from the pump emitter 572 through the signal window 510 to the third reflector 574, and from the third reflector 574 to an intersection with the signal path 532 in the sensor cavity 514. The microfabricated sensor 500 may be configured to prevent pump electromagnetic radiation emitted by the pump emitter 572 along the pump path 576 from re-entering the sensor cavity 514 after the pump electromagnetic radiation intersects the signal path 532. For example, the sensor cell 502 may include a fourth reflector, not shown in FIG. 5, which is configured to reflect the pump electromagnetic radiation through the signal window 510 to an absorber, not shown in FIG. 5, disposed outside of the sensor cell 502.

An optical focusing element 578 such as a lens may be disposed in the signal path 532, for example at the signal emitter 504, to improve a fraction of the emitted signal that is collected by the signal detector 506. The optical focusing element 578 may be a separate element which is attached to the signal emitter 504, or may be formed as part of the signal emitter 504, for example as a Fresnel lens in an upper dielectric layer of the signal emitter 504.

During operation of the microfabricated sensor 500, the pump emitter 572 may emit the pump electromagnetic radiation to the third reflector 574 and into the signal path 532 in the sensor cavity 514, where at least a portion of the pump electromagnetic radiation is absorbed by the sensor fluid. Atoms of the sensor fluid which absorb the pump electromagnetic radiation are thus raised to higher energy levels, which may enhance performance of the microfabricated sensor 500 by enabling a signal from the signal emitter 504 to probe the atoms in the higher energy levels without interference from atoms of the sensor fluid in lower energy levels, providing a cleaner signal at the signal detector 506.

The first reflector 522, the second reflector 524 and the third reflector 574 may have structures as disclosed by any of the examples herein. The microfabricated sensor 500 may include a fourth reflector configured to reflect the pump electromagnetic radiation from the third reflector 574 to an absorber outside of the sensor cavity 514. The signal emitter 504, the signal detector 506 and the pump emitter 572 may be disposed on a base support structure 534 with a standoff structure 536. Other configurations for the signal emitter 504, the signal detector 506 and the pump emitter 572, for example being directly attached to the signal window 510 outside of the sensor cavity 514, are within the scope of the instant example.

Figure 6:
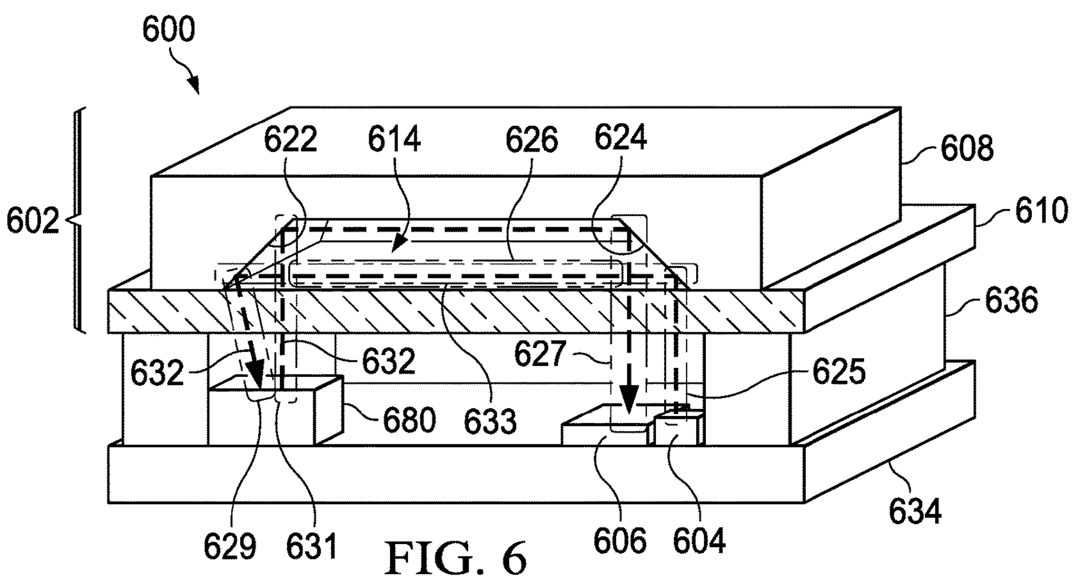
FIG. 6 is a cross section of another example microfabricated sensor.

FIG. 6 is a cross section of another example microfabricated sensor. The microfabricated sensor 600 includes a sensor cell 602, a signal emitter 604, a signal detector 606, and an external reflector 680 outside of the sensor cell 602. The signal emitter 604 may be a VCSEL or other appropriate radiant signal source. The signal detector 606 may be, for example a solid state photodetector. The external reflector 680 may include, for example, a metal reflective element, a multi-layer dielectric reflective element, or other reflective element appropriate for electromagnetic radiation from the signal emitter 604.

The sensor cell 602 includes an integrated cell body 608 attached to a signal window 610. In an alternate version of the instant example, the integrated cell body 608 may be replaced with a cell body attached to a top plate. A sensor cavity 614 is enclosed by the cell body 608 and the signal window 610. Sensor fluid material, not shown in FIG. 6, may be disposed in the sensor cavity 614, for example in a vapor phase distributed throughout the sensor cavity 614.

The sensor cell 602 includes a first reflector 622 and a second reflector 624. In the instant example, a signal path 632, depicted in FIG. 6 by a dashed line, includes a emitter path segment 625, a first cavity path segment 626, a first relay path segment 629, a second relay path segment 631, a second cavity path segment 633, and a detector path segment 627. The emitter path segment 625 extends from the signal emitter 604 through the signal window 610 to the first reflector 622. The first cavity path segment 626 extends inside the cavity 614 from the first reflector 622 to the second reflector 624. The first relay path segment 629 extends from the second reflector 624 through the signal window 610 to the external reflector 680. The second relay path segment 631 extends from the external reflector 680 back through the signal window 610 to the second reflector 624. The second cavity path segment 633 extends inside the cavity 614 from the second reflector 624 to the first reflector 622. The detector path segment 627 extends from the first reflector 622 through the signal window 610 to the signal detector 606. The configuration of the instant example with the external reflector 680 may improve performance of the microfabricated sensor 600 by increasing a length of the signal path 632 in the sensor cavity 614, resulting from reflecting the signal back through the sensor cavity 614 to the signal detector 606.

The first reflector 622 and the second reflector 624 may have structures as disclosed by any of the examples herein. The signal emitter 604, the signal detector 606, and the external reflector 680 may be disposed on a base support structure 634 with a standoff structure 636. In one version of the instant example, the signal emitter 604 the signal detector 606 may be integrated in a single die, advantageously reducing assembly cost and complexity of the microfabricated sensor 600. The external reflector 680 may include a substrate with a reflective coating of aluminum or dielectric layers. Alternatively, the external reflector 680 may be a reflective coating formed on a portion of the base support structure 634. Other configurations for the signal emitter 604, the signal detector 606 and the external reflector 680 are within the scope of the instant example.

Figure 7:
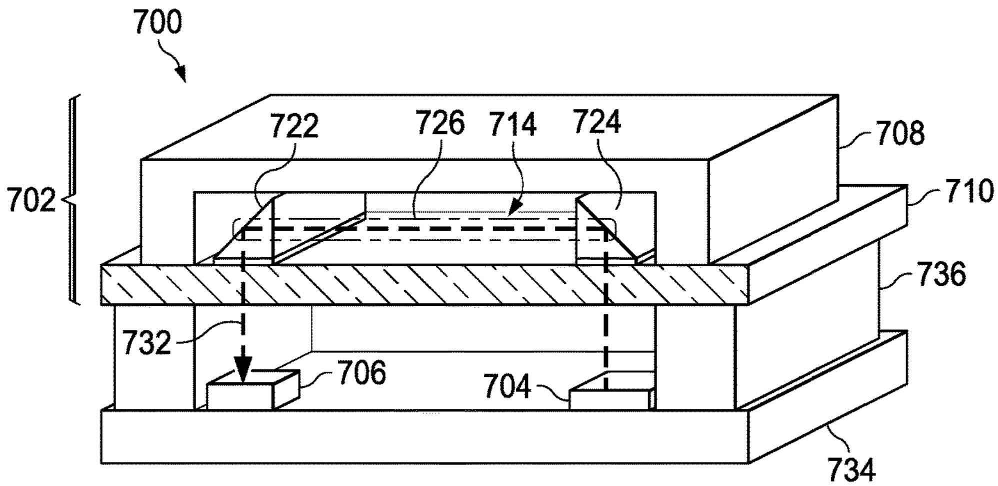
FIG. 7 is a cross section of another example microfabricated sensor.

FIG. 7 is a cross section of another example microfabricated sensor. The microfabricated sensor 700 includes a sensor cell 702, a signal emitter 704, and a signal detector 706. The sensor cell 702 includes an integrated cell body 708 attached to a signal window 710. In an alternate version of the instant example, the integrated cell body 708 may be replaced with a cell body attached to a top plate. A sensor cavity 714 is enclosed by the integrated cell body 708 and the signal window 710. Sensor fluid material, not shown in FIG. 7, may be disposed in the sensor cavity 714, for example in a vapor phase distributed throughout the sensor cavity 714.

The sensor cell 702 includes a first reflector 722 and a second reflector 724, separated by a cavity path segment 726 of signal path 732 in the sensor cavity 714. The signal path 732 is depicted in FIG. 7 by a dashed line. In the instant example, the first reflector 722 and the second reflector 724 are discrete components. The first reflector 722 and the second reflector 724 may be, for example, prism reflectors as depicted in FIG. 7. Alternately, the first reflector 722 and the second reflector 724 may be flat reflectors such as first surface reflectors. Other discrete reflectors for the first reflector 722 and the second reflector 724 are within the scope of the instant example. The first reflector 722 and the second reflector 724 may be attached to the signal window 710 by a suitable method such as an optically transparent adhesive, as depicted in FIG. 7. Alternately, the first reflector 722 and the second reflector 724 may be attached to the integrated cell body 708. Other means for positioning the first reflector 722 and the second reflector 724 in the sensor cell 702 are within the scope of the instant example. Having the first reflector 722 and the second reflector 724 as discrete components may advantageously enable a desired level of optical performance, and independently enable a low-cost method to form the integrated cell body 708. The signal emitter 704 and the signal detector 706 may be configured according to any of the examples disclosed herein. The signal emitter 704 and the signal detector 706 may be disposed on a base support structure 734 with a standoff structure 736. Other configurations for the signal emitter 704 and the signal detector 706 are within the scope of the instant example.

Figure 8:
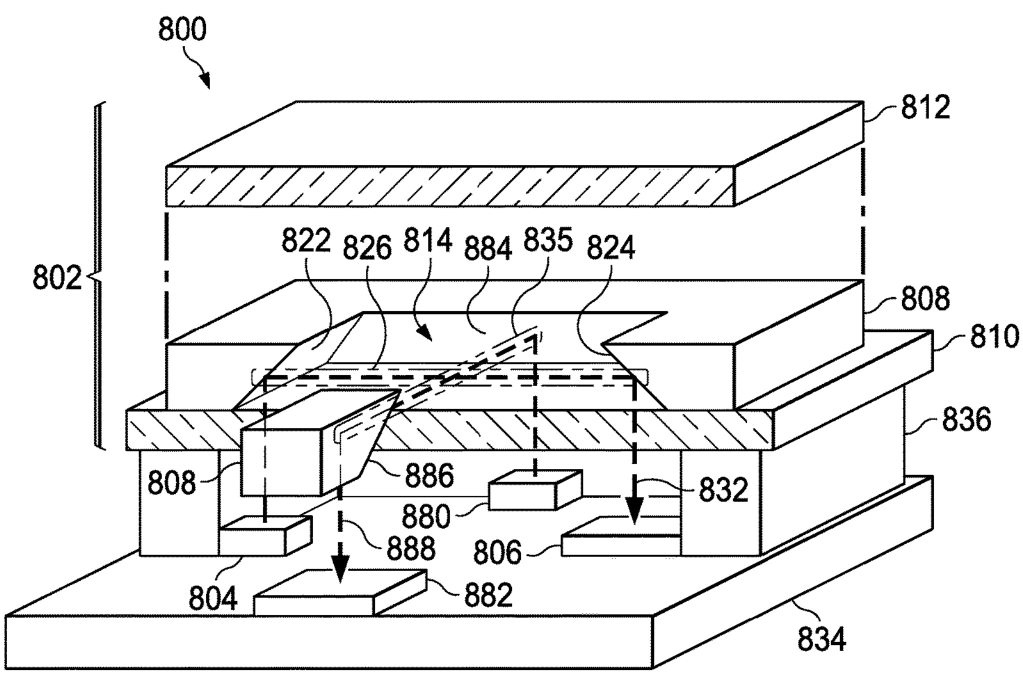
FIG. 8 is a cross section of another example microfabricated sensor.

FIG. 8 is a cross section of another example microfabricated sensor. The microfabricated sensor 800 includes a sensor cell 802, a first signal emitter 804, a first signal detector 806, a second signal emitter 880, and a second signal detector 882. The first signal emitter 804 and the second signal emitter 880 may both be configured to emit electromagnetic radiation with similar or identical wavelengths. For example, the first signal emitter 804 and the second signal emitter 880 may both be VCSELs. The first signal detector 806 and the second signal detector 882 may be, for example, solid state photodetectors.

The sensor cell 802 includes a cell body 808 attached to a signal window 810, and a top plate 812 attached to the cell body 808 opposite from the signal window 810. A sensor cavity 814 is enclosed by the cell body 808, the signal window 810 and the top plate 812. The top plate 812 of the sensor cell 802 is depicted separated from the cell body 808 in FIG. 8 to more clearly show the configuration in the sensor cavity 814. Sensor fluid material, not shown in FIG. 8, may be disposed in the sensor cavity 814, for example in a vapor phase distributed throughout the sensor cavity 814.

The sensor cell 802 includes a first reflector 822 and a second reflector 824, separated by a first cavity path segment 826 in the sensor cavity 814. The first cavity path segment 826 is part of a first signal path 832, which extends from the first signal emitter 804 through the cavity 814 to the first signal detector 806. The first signal path 832 is depicted in FIG. 8 by a dashed line.

In the instant example, the sensor cell 802 further includes a third reflector 884 and a fourth reflector 886, separated by a second cavity path segment 835 in the sensor cavity 814. The second cavity path segment 835 is part of a second signal path 888, which extends from the second signal emitter 880 through the cavity 814 to the second signal detector 882. The second signal path 888 is depicted in FIG. 8 by a dashed line.

In one version of the instant example, the second signal path 888 may intersect the first signal path 832 in the sensor cavity 814 as depicted in FIG. 8. In another version, the third reflector 884 may be an extension of the first reflector 822 and the fourth reflector 886 may be an extension of the second reflector 824, so that the second signal path 888 may be substantially parallel to the first signal path 832 in the sensor cavity 814. During operation of the microfabricated sensor 800, the second signal emitter 880 and the second signal detector 882 may be operated independently of, or in combination with, the first signal emitter 804 and the second signal detector 806, to enhance performance of the microfabricated sensor 800.

The first reflector 822, the second reflector 824, the third reflector 884, and the fourth reflector 886 may have structures as disclosed by any of the examples herein. The first signal emitter 804, the first signal detector 806, the second signal emitter 880, and the second signal detector 882 may be disposed on a base support structure 834 with a standoff structure 836.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A microfabricated sensor, comprising:
- a sensor cell, comprising:
  - a cell body;
  - a signal window attached to the cell body, wherein the cell body and the signal window at least partially enclose a sensor cavity;
  - sensor material disposed in the sensor cavity;
  - a first reflector located in the sensor cavity, the first reflector contacting the signal window and having an angle of about 45 degrees with the signal window; and
  - a second reflector located in the sensor cavity, the second reflector separated from the first reflector by a cavity path segment which is also located in the sensor cavity, the second reflector contacting the signal window and having an angle of about 45 degrees with the signal window;
- a signal emitter disposed outside the sensor cavity and separated from the first reflector by an emitter path which extends through the signal window; and
- a signal detector disposed outside the sensor cavity and separated from the second reflector by a detector path segment which extends through the signal window.

2. The microfabricated sensor of claim 1, wherein:
- the cell body comprises a single crystal silicon;
- the first reflector is defined by a first crystallographic plane of the cell body; and
- the second reflector is defined by a second crystallographic plane of the cell body.

3. The microfabricated sensor of claim 2, wherein:
- the cell body has a crystal orientation that is about 9.7 degrees off of a <100> orientation;
- the first reflector is defined by a first <111> crystallographic plane of the cell body; and
- the second reflector is defined by a second <111> crystallographic plane of the cell body.

4. The microfabricated sensor of claim 1, wherein the sensor material comprises cesium.

5. The microfabricated sensor of claim 1, further comprising a quarter wave circular polarizer disposed between the signal emitter and the sensor cavity.

6. The microfabricated sensor of claim 1, further comprising a pump emitter disposed outside of the sensor cavity, and wherein the sensor cell further comprises a third reflector, wherein the pump emitter is separated from the third reflector by a pump path segment of a pump path which intersects with the cavity path segment.

7. The microfabricated sensor of claim 1, further comprising an optical focusing element disposed between the signal emitter and the first reflector.

8. The microfabricated sensor of claim 1, wherein the sensor cell comprises a top plate attached to the cell body opposite from the signal window.

9. The microfabricated sensor of claim 1, wherein the cell body extends across the sensor cavity opposite from the signal window, so that the sensor cavity is bounded by the cell body and the signal window.

10. The microfabricated sensor of claim 1, wherein the first reflector comprises a first coating and the second reflector comprises a second coating.

11. The microfabricated sensor of claim 1, wherein:
- the cavity path segment is a first cavity path segment, and the sensor cell further comprises:
  - a third reflector; and
  - a fourth reflector separated from the third reflector by a second cavity path segment which is located in the sensor cavity;
- the signal emitter is a first signal emitter, the emitter path segment is a first emitter path segment, and the microfabricated sensor further comprises a second signal emitter disposed outside the sensor cavity and separated from the third reflector by a second emitter path segment which extends through the signal window; and the signal detector is a first signal detector, the detector path segment is a first detector path segment, and the microfabricated sensor further comprises a second signal detector disposed outside the sensor cavity and separated from the fourth reflector by a second detector path segment which extends through the signal window.

12. A method of forming a microfabricated sensor, comprising:

forming a cell body of a sensor cell, comprising:

forming a cell body to have a region for a sensor cavity that is free of material of the cell body;

forming a first reflector in the sensor cavity;

forming a second reflector in the sensor cavity, the second reflector separated from the first reflector by a cavity path segment which is located in the sensor cavity;

placing sensor material in the sensor cavity;

attaching a signal window of the sensor cell to the cell body, wherein the cell body and the signal window at least partially enclose the sensor cavity, the first reflector contacting the signal window and having a first angle of about 45 degrees with the signal window and the second reflector contacting the signal window and having a second angle of about 45 degrees with the signal window;

forming a signal emitter located outside the sensor cavity, wherein the signal emitter is separated from the first reflector by an emitter path segment which extends through the signal window; and forming a signal detector located outside the sensor cavity, wherein the signal detector is separated from the second reflector by a detector path segment which extends through the signal window.

13. The method of claim 12, wherein forming the cell body comprises:

providing a single crystal silicon wafer;

forming an etch mask on the single crystal silicon wafer; and removing silicon from the single crystal silicon wafer in an area exposed by the etch mask using a crystallographic etch process.

14. The method of claim 13, wherein the single crystal silicon wafer has a crystal orientation about 9.7 degrees off a <100> crystal orientation.

15. The method of claim 13, wherein removing silicon from the single crystal silicon wafer is continued until the region for the sensor cavity extends through the single crystal silicon wafer.

16. The method of claim 13, wherein removing silicon from the single crystal silicon wafer is performed to leave silicon of the single crystal wafer extending across the region for the sensor cavity.

17. The method of claim 12, wherein forming the cell body further comprises attaching a top plate to the cell body, wherein the top plate is located opposite from the signal window.

18. The method of claim 12, wherein the sensor material comprises cesium.

19. The method of claim 12, wherein forming the first reflector comprises forming a first coating, and forming the second reflector comprises forming a second coating.

20. A microfabricated sensor, comprising:

a sensor cell, comprising:

a cell body;

a signal window attached to the cell body, wherein the cell body and the signal window at least partially enclose a sensor cavity;

sensor material disposed in the sensor cavity;

a first reflector located in the sensor cavity, the first reflector contacting the signal window and having an angle of about 45 degrees with the signal window; and a second reflector located in the sensor cavity, the second reflector separated from the first reflector by a cavity path segment which is also located in the sensor cavity, the second reflector contacting the signal window and having an angle of about 45 degrees with the signal window;

a signal emitter disposed outside the sensor cavity and separated from the first reflector by an emitter path segment which extends through the signal window;

a signal detector disposed outside the sensor cavity and separated from the first reflector by a detector path segment which extends through the signal window; and an external reflector disposed outside the sensor cavity and separated from the second reflector by a replay path segment which extends through the signal window.

* * * * *